United States Patent [19]

Chen

[11] Patent Number: 5,647,952
[45] Date of Patent: Jul. 15, 1997

[54] CHEMICAL/MECHANICAL POLISH (CMP) ENDPOINT METHOD

[75] Inventor: Lai-Juh Chen, Hsin-Chu, Taiwan

[73] Assignee: Industrial Technology Research Institute, Hsin-Chu, Taiwan

[21] Appl. No.: 625,277

[22] Filed: Apr. 1, 1996

[51] Int. Cl.[6] ................................................ H01L 21/66
[52] U.S. Cl. ........................ 156/636.1; 156/626.1; 216/84; 216/88; 216/89; 216/38; 437/8; 437/225
[58] Field of Search ............... 156/626.1, 636.1; 216/38, 84, 89; 437/8, 235, 238

[56] References Cited

U.S. PATENT DOCUMENTS

| | | | |
|---|---|---|---|
| 5,078,801 | 1/1992 | Malik | 134/29 |
| 5,196,353 | 3/1993 | Sandhu et al. | 437/8 |
| 5,234,868 | 8/1993 | Cote | 437/225 |
| 5,240,552 | 8/1993 | Yu et al. | 156/636 |
| 5,272,117 | 12/1993 | Roth et al. | 437/228 |
| 5,308,438 | 5/1994 | Cote et al. | 156/636 |
| 5,337,015 | 8/1994 | Lustig et al. | 324/671 |
| 5,393,708 | 2/1995 | Hsia et al. | 437/228 |
| 5,413,941 | 5/1995 | Koos et al. | 437/8 |
| 5,514,616 | 5/1996 | Rostoker et al. | 437/57 |
| 5,516,346 | 5/1996 | Cadien et al. | 51/308 |
| 5,527,423 | 6/1996 | Neville et al. | 156/636.1 |
| 5,550,078 | 8/1996 | Sung | 437/52 |

*Primary Examiner*—R. Bruce Breneman
*Assistant Examiner*—Michael E. Adjodha
*Attorney, Agent, or Firm*—George O. Saile

[57] ABSTRACT

An improved and new process for chemical/mechanical planarization (CMP) of a substrate surface, wherein the endpoint for the planarization process is detected by monitoring the temperature of the polishing pad with an infrared temperature measuring device, has been developed. The process allows endpoint detection in-situ at the polishing apparatus, when polishing to remove a first layer of material and to stop the removal process when a second layer of material is exposed.

28 Claims, 4 Drawing Sheets

CHEMICAL/MECHANICAL POLISH (CMP) ENDPOINT METHOD

BACKGROUND OF THE INVENTION (1) Field of the Invention

This invention relates to a method and apparatus for determining an endpoint in a chemical-mechanical process for polishing the surface of a semiconductor wafer. More specifically, the invention is directed to the method of endpoint detection when polishing to remove a first layer of material and to stop the removal process when a second layer of material is exposed.

(2) Description of Related Art

In the fabrication of semiconductor components, metal conductor lines are formed over a substrate containing device circuitry. The metal conductor lines serve to interconnect discrete devices, and thus form integrated circuits. The metal conductor lines are further insulated from the next interconnection level by thin films of insulating material deposited by, for example, CVD (Chemical Vapor Deposition) of oxide or application of SOG (Spin On Glass) layers followed by fellow processes. Holes formed through the insulating layers provide electrical access between successive conductive interconnection layers. In such wiring processes, it is desirable that the insulating layers have a smooth surface topography, since it is difficult to lithographically image and pattern layers applied to rough surfaces.

Recently chemical-mechanical polishing (CMP) has been developed for providing smooth insulator topographies. CMP can also be used to remove different layers of material from the surface of a semiconductor wafer. For example, following via hole formation in a dielectric material layer, a metallization layer is blanket deposited and then CMP is used to produce planar metal studs. Briefly, the CMP processes involve holding and rotating a thin, flat wafer of the semiconductor material against a wetted polishing surface under controlled chemical, pressure, and temperature conditions. A chemical slurry containing a polishing agent, such as alumina or silica, is used as the abrasive material. Additionally, the chemical slurry contains selected chemicals which etch various surfaces of the wafer during processing. The combination of mechanical and chemical removal of material during polishing results in superior planarization of the polished surface. In this process it is important to remove a sufficient amount of material to provide a smooth surface, without removing an excessive amount of underlying materials. Therefore, a precise polishing endpoint detection technique is needed.

In the past, endpoint has been detected by interrupting the CMP process, removing the wafer from the polishing apparatus, and physically examining the wafer surface by techniques which ascertain film thickness and/or surface topography. If the wafer does not meet specifications, it must be loaded back into the polishing apparatus for further planarization. If excess material has been removed, the wafer may not meet specifications and will be substandard. This endpoint detection method is time consuming, unreliable, and costly. Therefore, numerous improvements to endpoint detection during CMP have been invented, as shown in the following patents.

U.S. Pat. No. 5,234,868 entitled "Method For Determining Planarization Endpoint During Chemical-Mechanical Polishing" granted Aug. 10, 1993 to William J. Cote describes a monitor structure surrounded by a moat. The moat causes polish removal to proceed faster at the monitor structure than at regions not surrounded by a moat. Polishing proceeds until the top of the monitor structure is exposed and results in a layer of planarized insulation above the metal pattern not surrounded by a moat. Visual inspection is employed to determine exposure of the top of the monitor structure. Alternately, monitoring is done electrically by detecting an electrical connection between the top of the metal monitor structure and the polishing pad.

U.S. Pat. No. 5,240,552 entitled "Chemical Mechanical Planarization (CMP) Of A Semiconductor Wafer Using Acoustical Waves For In-situ End Point Detection" granted Aug. 31, 1993 to Chris C. Yu et al directs acoustical waves at the wafer during CMP and through analysis of the reflected waveform controls the planarization process.

U.S. Pat. No. 5,308,438 entitled "Endpoint Detection Apparatus and Method For Chemical/Mechanical Polishing" granted May 3, 1994 to William J. Cote et al describes an endpoint detection method in which the power required to maintain a set rotational speed in a motor rotating the substrate is monitored. Endpoint is detectable because the power required to maintain a set rotational speed in a motor rotating the substrate significantly drops when the difficult to polish layer is removed.

U.S. Pat. No. 5,337,015 entitled "In-situ Endpoint Detection Method and Apparatus for Chemical-Mechanical Polishing Using Low Amplitude Input Voltage" granted Aug. 9, 1994 to Naftali E. Lustig et al utilizes electrodes built into the polishing pad, and a high frequency, low voltage signal, and detection means as a method for measuring the thickness of a dielectric layer being polished.

U.S. Pat. No. 5,413,941 entitled "Optical End Point Detection Methods in Semiconductor Planarizing Polishing Processes" granted May 9, 1995 to Daniel A. Koos et al describes a method for endpoint detection for polishing by impinging laser light onto the substrate being polished and measuring the reflected light. The intensity of the reflected light is a measure of the planarity of the polished surface.

U.S. Pat. No. 5,196,353 entitled "Method For Controlling a Semiconductor (CMP) Process By Measuring a Surface Temperature and Developing a Thermal Image of the Wafer" granted Mar. 23, 1993 to Gurtej S. Sandhu et al describes the use of infrared radiation detection to measure the surface temperature of a semiconductor wafer during a polishing process. Sudden changes of temperature at the wafer surface during the polishing process can be used to detect an endpoint.

The present invention is directed to a novel method for in-situ endpoint detection during a chemical/mechanical planarization (CMP) process using infrared monitoring of the temperature of the polishing pad. An abrupt change in temperature of the polishing pad is a result of a change in friction between the pad and the polished surface when, for example, one layer is removed and another layer is contacted by the polishing pad. The method provides a novel, inexpensive means to detect endpoint during CMP and is easily implemented on state-of-the-art polishing apparatus.

SUMMARY OF THE INVENTION

One object of the present invention is to provide an improved and new process for chemical/mechanical planarization (CMP) of a substrate surface, wherein the endpoint for the planarization process is detected by monitoring the temperature of the polishing pad with an infrared temperature measuring device.

Another object of the present invention is to provide a new and improved process for chemical/mechanical planarization (CMP) in which endpoint is detected in-situ at the polishing apparatus, without the necessity to unload the substrate for visual inspection or performance of specialized, time-consuming, and costly thickness and/or surface topography measurements.

A further object of the present invention is to provide a new and improved process for in-situ endpoint detection during a chemical/mechanical planarization (CMP) process using infrared monitoring of the temperature of the polishing pad to detect a polishing pad temperature change which reults from a change in friction between the pad and the polished surface when, for example, one layer is removed and another layer is contacted by the polishing pad. In one embodiment of the invention, endpoint is detected when the polishing pad temperature increases as the polishing process proceeds from a soft, easily polished material, such as PE-TEOS (Plasma Enhanced oxide deposited from Tetraethylorthosilicate), to a hard, difficult to polish material, such as SOG (Spin-On Glass). In a second embodiment of the invention, endpoint is detected when the polishing pad temperature decreases as the polishing process proceeds from a difficult to polish material, such as tungsten to a more easily polished material, such as titanium nitride.

In an illustrative embodiment, apparatus for carrying out the method of the invention includes: a wafer carrier and rotating polishing platen for chemically/mechanically planarizing (CMP) the semiconductor wafer, a rotating polishing pad, means of controlling the temperature of a chemical/ mechanical polishing slurry, means of dispensing the chemical/mechanical polishing slurry onto the polishing pad, an infrared temperature detection device for monitoring the temperature of the polishing pad, and detection of endpoint when a change in temperature of the rotating polishing pad occurs due to removal of a first material and contact by the rotating polishing pad to a second material.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of planarizing the surface of a semiconductor substrate, using chemical/mechanical polishing (CMP), and the new and improved method of endpoint detection will now be described in detail. The method can be used for planarizing insulator surfaces, such as silicon oxide or silicon nitride, deposited by chemical vapor deposition, or insulating layers, such as glasses deposited by spin-on and reflow deposition means, over semiconductor devices and/or conductor interconnection wiring patterns.

Figure 1A:
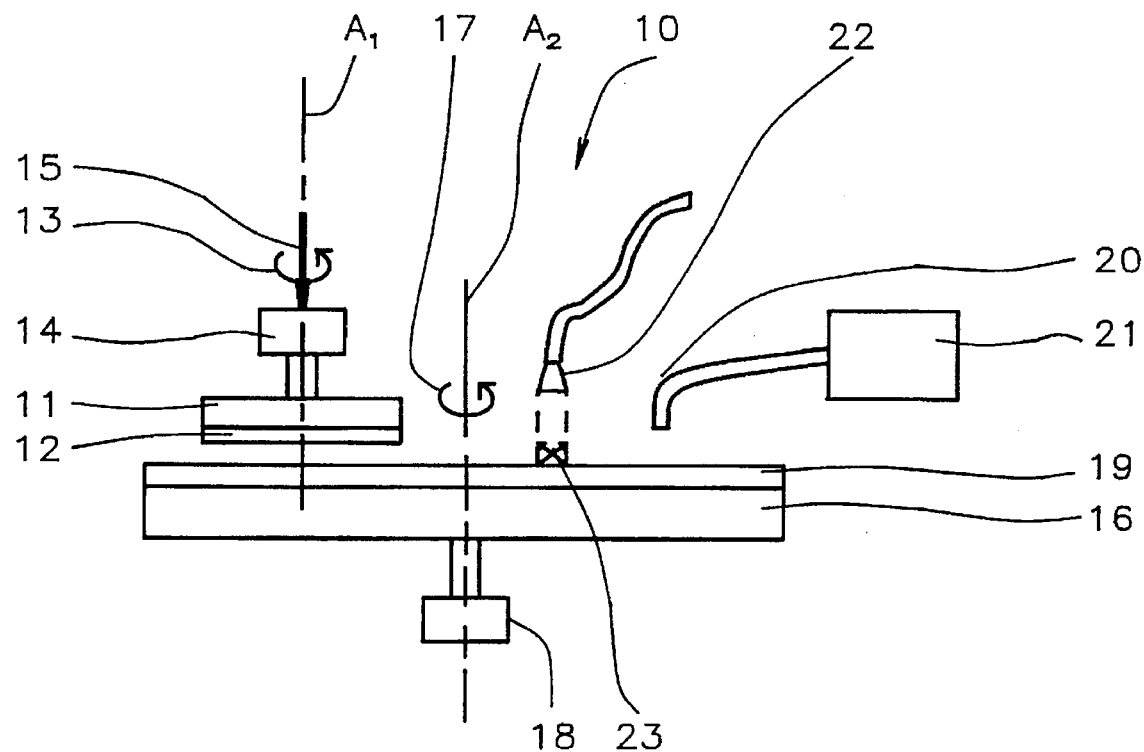
FIG. 1A, which schematically, in cross-sectional representation, illustrates a polishing apparatus, used in accordance with the method of the invention.
Figure 1B:
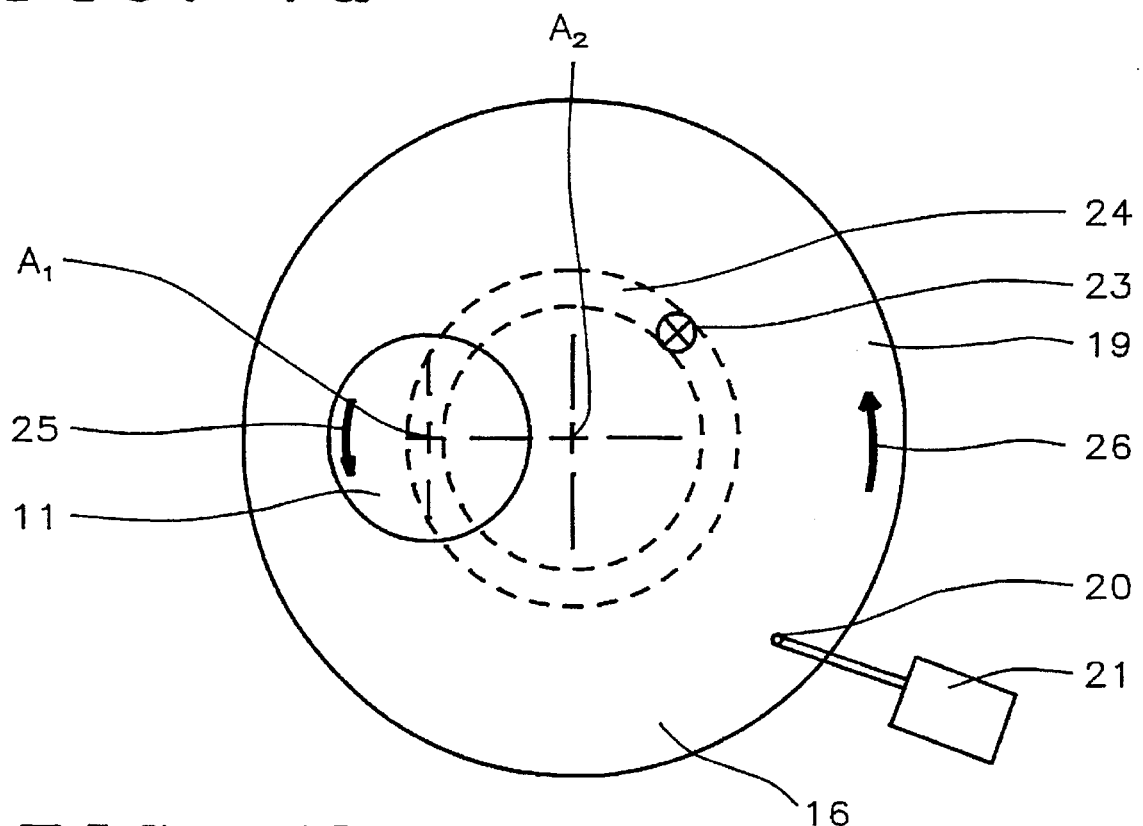
FIG. 1B, which is a top view of the apparatus illustrated in FIG. 1A.

FIGS. 1A and 1B are schematic views of a chemical/ mechanical planarization (CMP) apparatus for use in accordance with the method of the invention. In FIG. 1A, the CMP apparatus, generally designated as 10, is shown schematically in cross-sectional representation. The CMP apparatus, 10, includes a wafer carrier, 11, for holding a semiconductor wafer, 12. The wafer carrier, 11, is mounted for continuous rotation about axis, A1, in a direction indicated by arrow, 13, by a drive motor, 14. The wafer carrier, 11, is adapted so that a force indicated by arrow, 15, is exerted on semiconductor wafer, 12. The CMP apparatus, 10, also includes a polishing platen, 16, mounted for continuous rotation about axis, A2, in a direction indicated by arrow, 17, by a drive motor, 18. A polishing pad, 19, formed of a material such as blown polyurethane, is mounted to the polishing platen. A polishing slurry containing an abrasive fluid, such as silica or alumina abrasive particles suspended in either a basic or an acidic solution, is dispensed onto the polishing pad, 19, through a conduit, 20, from a temperature controlled reservoir, 21. An infrared radiation detection device, 22, is mounted so as to detect infrared radiation emitted from an area, 23, designated by X. The area, 23, traces an annular ring, 24, on the polishing pad, 19, as shown in FIG. 1B, due to the continuous rotation of the polishing pad, 19. The location of the area, 23, is within the portion of the polishing pad, 19, that abrades the semiconductor wafer, 12, during rotation of the polishing pad, 19.

In FIG. 1B, which is a schematic top view of the CMP apparatus, 10, shown in FIG. 1A, the key elements are shown. Wafer carrier, 11, is shown to rotate in a direction indicated by arrow, 25, about an axis, A1. Polishing platen, 16, is shown to rotate in a direction indicated by arrow, 26, about an axis, A2. The polishing slurry is dispensed onto the polishing pad, 19, through conduit, 20, from a temperature controlled reservoir, 21. The infrared detection device, 22, (shown in FIG. 1A), receives infrared radiation emitted from an area, 23, designated X. The area, 23, describes a portion of the area of the polishing pad, 19, within the annular ring, 24.

Figure 2:
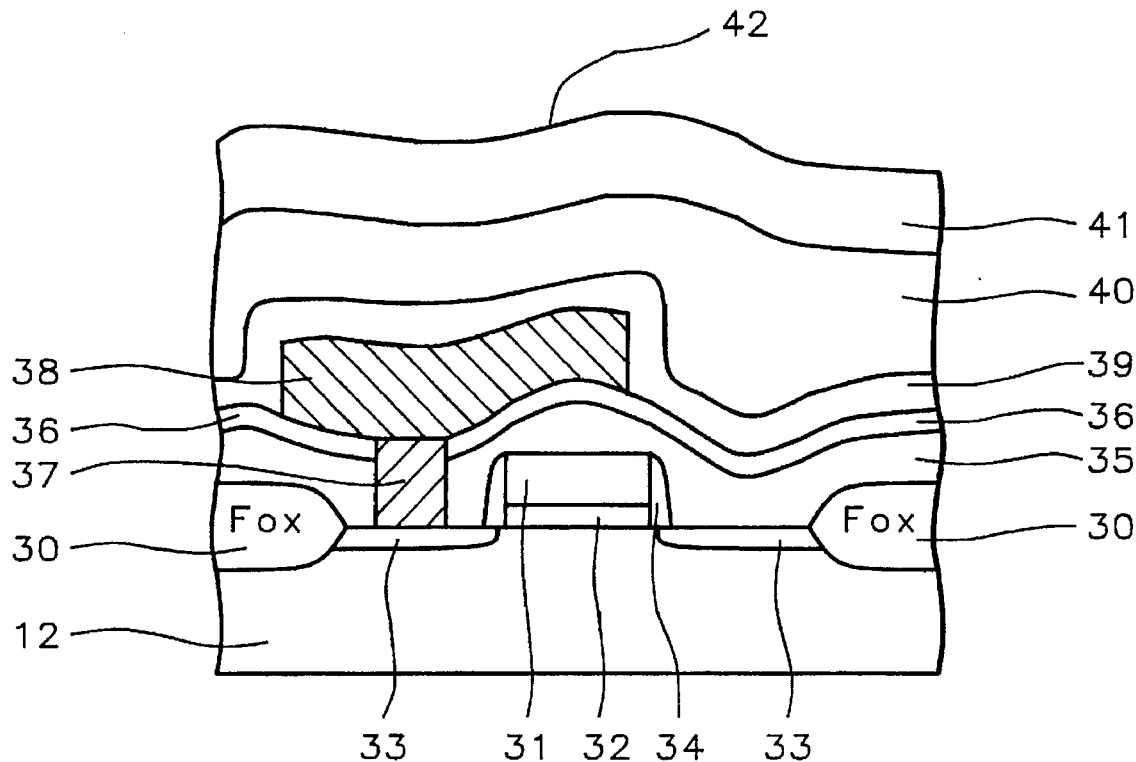
FIGS. 2-3, which schematically, in cross-sectional representation, illustrate planarization of the surface of a composite dielectric layer on a semiconductor substrate.
Figure 3:
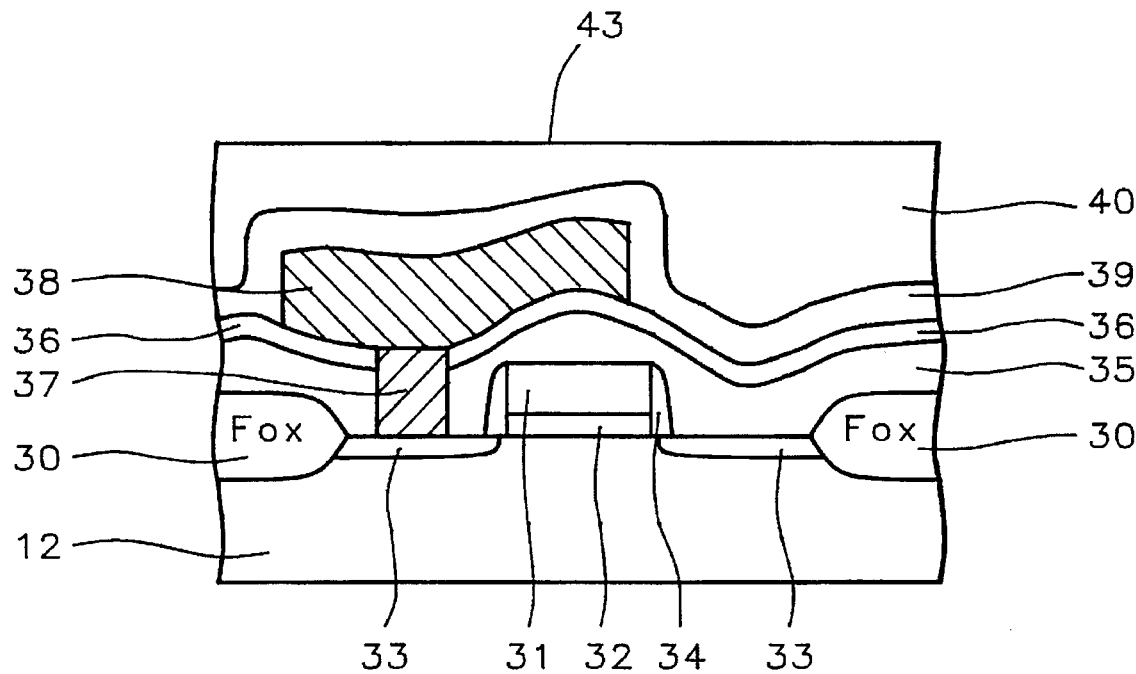

FIGS. 2 and 3, schematically in cross-sectional representation, show the chemical/mechanical planarization (CMP) of a semiconductor wafer containing a metallized MOSFET device onto which has been deposited a composite dielectric overlayer of PE-TEOS/SOG/PE-TEOS. A typical NFET, (N-type Field Effect Transistor) device, as shown in FIG. 2, consists of a semiconductor wafer, 12, composed of P-type, single crystal silicon with a <100> orientation; a thick field oxide region, 30, (FOX); a polysilicon gate, 31; gate oxide, 32; source and drain regions, 33; sidewall spacers, 34; LPCVD deposited layers of silicon oxide, 35, and silicon nitride, 36; interlevel connecting plug, 37; conducting interconnection pattern, 38; first PE-TEOS layer, 39; SOG layer, 40; and second PE-TEOS layer, 41. The first PE-TEOS layer, 39, is deposited using plasma enhanced deposition from tetraethylorthosilicate, at a temperature between about 200° to 410° C., to a thickness between about 2,000 to 5,000 Angstroms. The SOG layer, 40, comprises application of between about 2 to 4 layers of spin-on-glass, followed by reflow at a temperature between about 250° to 450° C., resulting in a thickness between about 4,000 to 8,000 Angstroms. The second PE-TEOS layer, 41, is deposited using plasma enhanced deposition from tetraethylorthosilicate, at a temperature between about 200° to 400° C., to a thickness between about 2,000 to 5,000 Angstroms. Planarization of the surface topography, 42, shown in FIG. 2, is performed using chemical/mechanical polishing (CMP) in an apparatus as generally illustated in FIGS. 1A and 1B and results in a substantially planar SOG surface, 43, as shown in FIG. 3.

The method of endpoint detection during chemical/ mechanical (CMP) planarization of the surface topography, 42, shown in FIG. 2, will now be described in detail. Referring to FIGS. 1A and 1B, a polishing slurry, such as commercially available Cabot SC-1, containing alumina and KOH, having a pH between about 10.0 to 10.3, is contained in reservoir, 21. The polishing slurry is controlled in the temperature range between about 10° to 30° C., and is dispensed through conduit, 20, so as to saturate polishing pad, 19. An infrared radiation detection device, 22, measures the temperature of an area, 23, on the polishing pad, 19. The semiconductor wafer, 12, is placed in the polishing apparatus, 10, with the second PE-TEOS layer, 41, face down against the polishing pad, 19. The polishing platen motor, 18, has its speed set at between about 10 to 70 rpm and the wafer carrier drive motor, 14, is set to rotate at a speed of between about 10 to 70 rpm. The wafer carrier, 11, is set to apply a pressure of between about 1 to 10 psi between the wafer and the polishing pad, through the application of force, 15.

Figure 4:
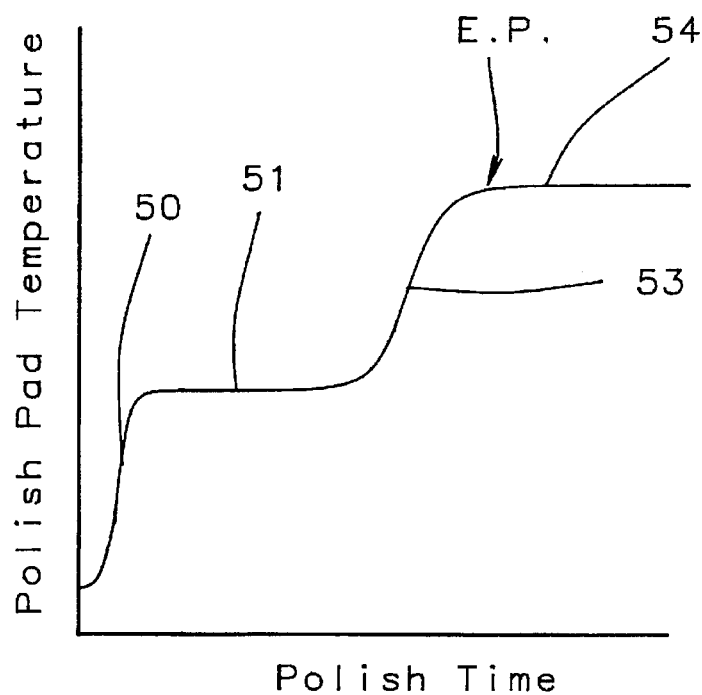
FIG. 4, which shows the behavior of infrared detected polishing pad temperature versus time, when using chemical/mechanical polishing to planarize the surface of the composite dielectric layer on a semiconductor substrate, with the desired endpoint indicated.

The method of using the measured temperature of the polishing pad to detect endpoint is depicted in FIG. 4, which shows the behavior of infrared detected polishing pad temperature versus time, when using chemical/mechanical polishing to planarize the surface of the semiconductor wafer. As the second PE-TEOS layer, 41, first begins to be polished the temperature of the polishing pad increases, indicated by 50, because of the friction between the fibers of the pad, the abrading particles in the polishing slurry, and the PE-TEOS layer. The temperature of the polishing pad remains at a substantially steady level, indicated by 51, during the polishing of the PE-TEOS layer. When the polishing pad makes contact to the SOG layer, 40, which is a more difficult material to polish, the friction between the fibers of the pad, the abrading particles in the polishing slurry, and the polished surface increases and the temperature of the polishing pad increases, as indicated by 53. Finally the temperature of the polishing pad levels off at a higher value, indicated by 54, which is a result of the higher friction between the fibers of the pad, the abrading particles in the polishing slurry, and the SOG layer, 40. Endpoint, (E.P.), is selected as the time at which the polishing pad temperature indicates that the second PE-TEOS layer, 41, has been removed. The resulting SOG surface, 43, is substantially planar.

Figure 5:
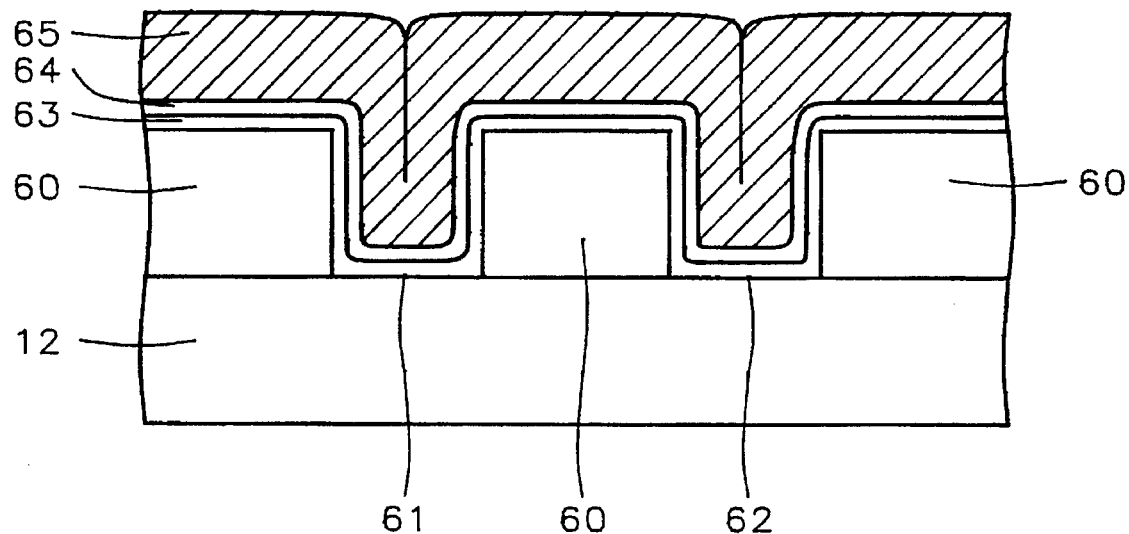
FIGS. 5-6, which schematically, in cross-sectional representation, illustrate the fabrication by chemical/ mechanical polishing of tungsten contact studs embedded in silicon oxide.
Figure 6:
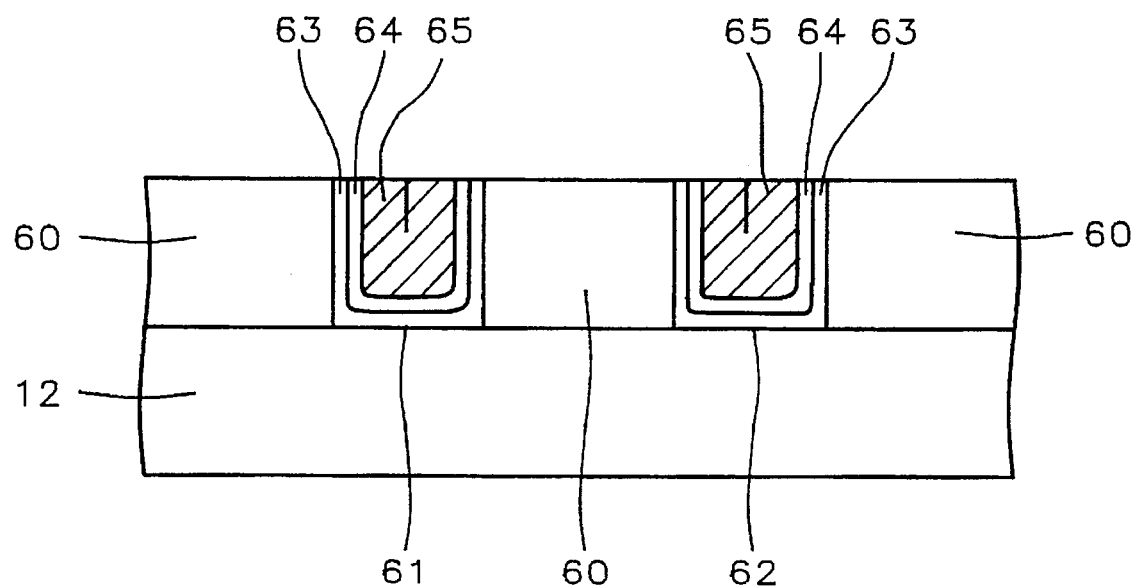

A second embodiment of the invention is now described. FIGS. 5 and 6, schematically in cross-sectional representation, show the chemical/mechanical planarization (CMP) of a semiconductor substrate, 12, coated with a layer of silicon oxide, 60, containing openings, 61 and 62, therein. The openings, 61 and 62, provide contact to active devices or to a metal interconnection level. The active devices or metal interconnection level are not shown here, since they do not constitute part of the present invention. Over the oxide, 60, is deposited composite layers of barrier materials, comprising a titanium layer, 63, and a titanium nitride layer, 64. Formation of such barrier layers is common in the industry and may be deposited by sputtering from a titanium target. The layers may be separately deposited by first sputtering from a titanium target in an inert atmosphere, such as argon and then sputtering from a titanium target in a nitrogen atmosphere to form titanium nitride; or a layer of titanium is first deposited, which when exposed to a nitrogen atmosphere will form thereon a layer of titanium nitride. The thicknesses of the barrier layers are between about 100 to 500 Angstroms titanium, 63, and between about 500 to 2,000 Angstroms titanium nitride, 64. Over the layer of titanium nitride, 64, is deposited tungsten, 65, by LPCVD processing using $WF_6$, at a flow between about 40 to 100 sccm, at a temperature between about 350° to 500° C., to a thickness between about 2,000 to 10,000 Angstroms. It is critical to deposit a tungsten layer, which is thick enough to completely fill openings, 61 and 62. The LPCVD process is effective in this regard because in this process the tungsten film growth occurs on both the vertical and horizontal surfaces.

The semiconductor substrate, 12, is placed in the polishing apparatus, schematically illustrated in FIGS. 1A and 1B, with the tungsten layer, 65, face down against the polishing pad, 19. Referring to FIGS. 1A and 1B, a polishing slurry consisting of $Al_2O_3$ and a ferric nitrate solution in $H_2O$, contained in reservoir, 21, is controlled in the temperature range between about 10° to 30° C., and is dispensed through conduit, 20, so as to saturate polishing pad, 19. An infrared radiation detection device, 22, measures the temperature of an area, 23, on the polishing pad, 19. The polishing platen motor, 18, has its speed set at between about 10 to 70 rpm and the wafer carrier drive motor, 14, is set to rotate at a speed of between about 10 to 70 rpm. The wafer carrier, 11, is set to apply a pressure of between about 1 to 10 psi between the wafer and the polishing pad, through the application of force, 15. Chemical/mechanical polishing (CMP) proceeds until all of the tungsten, 65, is removed, except for the tungsten remaining in the openings, 61 and 62.

Figure 7:
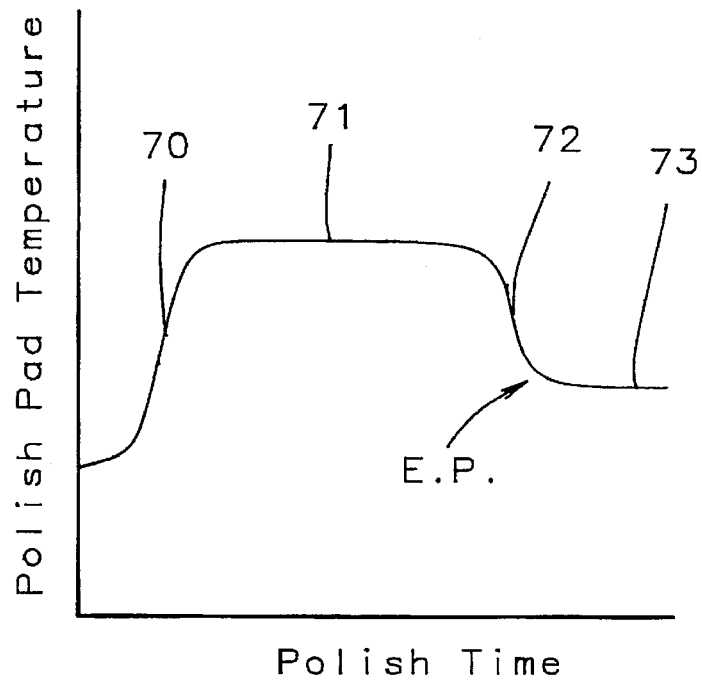
FIG. 7, which shows the behavior of infrared detected polishing pad temperature versus time, when using chemical/mechanical polishing to fabricate planar tungsten contact studs embedded in silicon oxide, with the desired endpoint indicated.

The method of using the measured temperature of the polishing pad to detect endpoint in this second embodiment of the invention is depicted in FIG. 7, which shows the behavior of infrared detected polishing pad temperature versus time, when using chemical/mechanical polishing to remove tungsten, 65, everywhere except in openings, 61 and 62. As the tungsten, 65, first begins to be polished the temperature of the polishing pad increases, indicated by 70, because of the friction between the fibers of the pad, the abrading particles in the polishing slurry, and the tungsten layer. The temperature of the polishing pad remains at a substantially steady level, indicated by 71, during the polishing of the tungsten layer. When the polishing pad makes contact to the titaniun nitride layer, 64, which is a less difficult material to polish, the friction between the fibers of the pad, the abrading particles in the polishing slurry, and the polished surface decreases and the temperature of the polishing pad decreases, as indicated by 72. Finally the temperature of the polishing pad levels off at a lower value, indicated by 73, which is a result of the lower friction between the fibers of the pad, the abrading particles in the polishing slurry, and the titanium nitride layer, 64. Endpoint, (E.P.), is selected as the time at which the polishing pad temperature indicates that the tungsten layer, 65, has been removed. Slight over-polishing beyond the detected endpoint then removes the easily polished titanium nitride, 64, and titanium, 63, and the resulting planar structure has tungsten connecting studs embedded in oxide, as shown in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A method of chemical/mechanical planarization (CMP) of a semiconductor substrate containing layers of different materials comprising:

planarizing the semiconductor substrate by holding the semiconductor substrate on a rotating platen against a rotating polishing pad in the presence of a polishing slurry;

controlling the temperature of the polishing slurry in the temperature range between about 10° to 30° C.;

dispensing said temperature controlled slurry onto said rotating polishing pad;

measuring by infrared detection means the temperature of said rotating polishing pad at a selected polishing pad location which is abrading the surface of said semiconductor substrate; and detecting an endpoint when a change in temperature of said rotating polishing pad occurs due to removal of a first material and contact by said rotating polishing pad to a second material.

2. The method of claim 1, wherein said polishing slurry comprises $SiO_2$ or $CeO_2$ and $NH_3$ or KOH.

3. The method of claim 1, wherein said temperature of said rotating polishing pad is measured in the temperature range between about 10° to 80° C.

4. The method of claim 1, wherein said first material is a hard, difficult to polish material and said second material is a soft, easy to polish material.

5. The method of claim 4, wherein endpoint is detected as a decrease in temperature of said rotating polishing pad due to removal of said hard, difficult to polish material and contact by said rotating polishing pad to said soft, easy to polish material.

6. The method of claim 1, wherein said first material is a soft, easy to polish material and said second material is a hard difficult to polish material.

7. The method of claim 6, wherein endpoint is detected as an increase in temperature of said rotating polishing pad due to removal of said soft, easy to polish material and contact by said rotating polishing pad to said hard, difficult to polish material.

8. A method for fabricating a planarized layer of dielectric material on a semiconductor substrate containing a structure, comprising the steps of:

providing said structure on said semiconductor substrate;

depositing a first layer of dielectric material onto said semiconductor substrate containing said structure;

depositing onto said first layer of dielectric material a second layer of dielectric material which is easier to polish than said first layer of dielectric material;

planarizing said second layer of dielectric material by holding said semiconductor substrate on a rotating platen against a rotating polishing pad in the presence of a polishing slurry and applied pressure between the platen and polishing pad;

controlling the temperature of the polishing slurry in the temperature range between about 10° to 30° C.;

dispensing the temperature controlled slurry onto the rotating polishing pad;

measuring by infrared detection means the temperature of the polishing pad at a location which is abrading the surface of said second layer of dielectric material; and detecting endpoint for the planarization process when the polishing pad temperature increases due to removal of the easier to polish second layer of material.

9. The method of claim 8, wherein said structure is an active device.

10. The method of claim 8, wherein said structure is an interconnection pattern of conducting material.

11. The method of claim 8, wherein said structure comprises both active devices and an interconnection pattern of conducting material.

12. The method of claim 9, wherein said active device is a NFET or PFET MOS device.

13. The method of claim 10, wherein said interconnection pattern of conducting material is aluminum having a thickness between about 4,000 to 10,000 Angstroms.

14. The method of claim 8, wherein said first layer of dielectric material is SOG, applied as between about 2 to 4 layers, followed by reflow at a temperature between about 250° to 450° C., resulting in a thickness between about 4,000 to 8,000 Angstroms.

15. The method of claim 8, wherein said second layer of dielectric material is PE-TEOS deposited from tetraethylorthossilicate, at a temperature between about 200° to 400° C., to a thickness between about 2,000 to 5,000 Angstroms.

16. The method of claim 8, wherein said polishing slurry comprises $SiO_2$ or $CeO_2$ and $NH_3$ or KOH controlled in the temperature range between about 10° to 30° C.

17. The method of claim 8, wherein said rotating polishing pad is rotated in a range between about 10 to 70 rpm.

18. The method of claim 8, wherein said rotating platen is rotated in a range between about 10 to 70 rpm.

19. The method of claim 8, wherein said applied pressure between the platen and polishing pad is in a range between about 1 to 10 psi.

20. The method of claim 8, wherein said polishing pad temperature increase is in a range between about 10° to 30° C.

21. A method for fabricating a planarized layer on a semiconductor substrate, wherein said semiconductor substrate contains a first layer of material having a first coefficient of friction deposited over a second layer of material having a second coefficient of friction, wherein said first coefficient of friction is larger than said second coefficient of friction, comprising the steps of:

planarizing said first layer of material by holding said semiconductor substrate on a rotating platen against a rotating polishing pad in the presence of a polishing slurry and applied pressure between the platen and polishing pad;

controlling the temperature of the polishing slurry in the temperature range between about 10° to 30° C.;

dispensing the temperature controlled slurry onto the rotating polishing pad;

measuring by infrared detection means the temperature of the polishing pad at a location which is abrading the surface of said first layer of dielectric material; and detecting endpoint for the planarization process when the polishing pad temperature decreases due to removal of said first layer of material.

22. The method of claim 21, wherein said first layer of material is tungsten, deposited using LPCVD at a temperature between about 350° to 500° C., to a thickness between about 2,000 to 10,000 Angstroms.

23. The method of claim 21, wherein said second layer of material is titanium nitride, deposited using sputtering or chemical vapor deposition (CVD), at a temperature between about 200° to 400° C., to a thickness between about 500 to 2,000 Angstroms.

24. The method of claim 21, wherein said polishing slurry comprises $Al_2O_3$ and a ferric nitrate solution in $H_2O$, controlled in the temperature range between about 10° to 30° C.

25. The method of claim 21, wherein said rotating polishing pad is rotated in a range between about 10 to 70 rpm.

26. The method of claim 21, wherein said rotating platen is rotated in a range between about 10 to 70 rpm.

27. The method of claim 21, wherein said applied pressure between the platen and polishing pad is in a range between about 1 to 10 psi.

28. The method of claim 21, wherein said polishing pad temperature decrease is in a range between about 10° to 30° C.

* * * * *